(12) United States Patent
Ikeno et al.

(10) Patent No.: US 12,416,098 B2
(45) Date of Patent: Sep. 16, 2025

(54) METHOD OF MANUFACTURING DIAMOND SUBSTRATE

(71) Applicants: Shin-Etsu Polymer Co., Ltd., Tokyo (JP); Shin-Etsu Chemical Co., Ltd., Tokyo (JP); National University Corporation Saitama University, Saitama (JP)

(72) Inventors: Junichi Ikeno, Saitama (JP); Yohei Yamada, Saitama (JP); Hideki Suzuki, Saitama (JP); Rika Matsuo, Saitama (JP); Hitoshi Noguchi, Tokyo (JP)

(73) Assignees: Shin-Etsu Polymer Co., Ltd., Tokyo (JP); Shin-Etsu Chemical Co., Ltd., Tokyo (JP); National University Corporation Saitama University, Saitama (JP)

( * ) Notice: Subject to any disclaimer, the term of this patent is extended or adjusted under 35 U.S.C. 154(b) by 230 days.

(21) Appl. No.: 17/856,207

(22) Filed: Jul. 1, 2022

(65) Prior Publication Data

US 2023/0002933 A1    Jan. 5, 2023

(30) Foreign Application Priority Data

Jul. 2, 2021 (JP) ................... 2021-110843

(51) Int. Cl.
*B23K 26/40* (2014.01)
*B23K 26/53* (2014.01)
(Continued)

(52) U.S. Cl.
CPC ............. *C30B 33/04* (2013.01); *B23K 26/40* (2013.01); *B23K 26/53* (2015.10);
(Continued)

(58) Field of Classification Search
CPC ......... C03B 33/04; C03B 33/08; C03B 29/04; B23K 26/53; B23K 26/40; C04B 31/0036; C04B 31/009; C04B 31/91
(Continued)

(56) References Cited

U.S. PATENT DOCUMENTS

| | | | |
|---|---|---|---|
| 2019/0232433 A1 | 8/2019 | Kitamura et al. | |
| 2020/0164469 A1 | 5/2020 | Bassett et al. | |

FOREIGN PATENT DOCUMENTS

| | | | |
|---|---|---|---|
| CN | 110691671 A | 1/2020 | |
| CN | 111745305 A | 10/2020 | |

(Continued)

*Primary Examiner* — Christina A Johnson
*Assistant Examiner* — Xue H Liu
(74) *Attorney, Agent, or Firm* — Nath, Goldberg & Meyer; Jerald L. Meyer

(57) ABSTRACT

A method of manufacturing a diamond substrate includes: a step of placing a laser condensing unit 190 configured to condense laser light B so as to face an upper surface 10a of a block 10 of single crystal diamond, a step of forming a modified layer 20, which includes a processing mark 21 of graphite and a crack 22b extending along a surface (111) around the processing mark 21, in a partial region of the upper surface 10a of the block 10 along the surface (111) of the single crystal diamond, along the surface (111) of the single crystal diamond at a predetermined depth from the upper surface 10a of the block 10 by radiating the laser light B on the upper surface 10a of the block 10 from the laser condensing unit 190 under predetermined conditions and condensing the laser light B inside the block 10, and moving the laser condensing unit 190 and the block 10 in a relative manner two-dimensionally, and a step of forming a cleavage plane 25 at the predetermined depth of the remaining region of the upper surface 10a of the block 10 by spontaneously propagating cleavage from the modified layer 20.

3 Claims, 9 Drawing Sheets

(51) Int. Cl.
 *C04B 41/00* (2006.01)
 *C04B 41/91* (2006.01)
 *C30B 29/04* (2006.01)
 *C30B 33/04* (2006.01)
 *C30B 33/08* (2006.01)

(52) U.S. Cl.
 CPC ........ *C04B 41/0036* (2013.01); *C04B 41/009* (2013.01); *C04B 41/91* (2013.01); *C30B 29/04* (2013.01); *C30B 33/08* (2013.01)

(58) Field of Classification Search
 USPC ....................................................... 264/400
 See application file for complete search history.

(56) References Cited

FOREIGN PATENT DOCUMENTS

| | | |
|---|---|---|
| JP | H6-234595 A | 8/1994 |
| JP | 2007-112637 A | 5/2007 |
| JP | 2009-061462 A | 3/2009 |
| JP | 2021080153 A | 5/2021 |
| TW | 201839801 A | 11/2018 |
| TW | 201945603 A | 12/2019 |
| TW | 2020013473 A | 4/2020 |
| WO | 2015046294 A1 | 4/2015 |
| WO | 2015107907 A1 | 7/2015 |

METHOD OF MANUFACTURING DIAMOND SUBSTRATE

CROSS REFERENCE TO RELATED APPLICATION

This application is based upon and claims the benefit of priority under 35 U.S.C. § 119 from Japanese Patent Application No. 2021-410843 filed on Jul. 2, 2021, the entire contents of which are incorporated herein by reference.

TECHNICAL FIELD

The present invention relates to a method of manufacturing a diamond substrate, and more particularly to a method of manufacturing a diamond substrate by processing single crystal diamond using laser light.

BACKGROUND

Conventionally, silicon carbide (SiC) and gallium nitride (GaN) have been provided as semiconductor materials suitable for power devices instead of silicon (Si). However, diamond semiconductors have attracted attention as a next-generation material because they have a higher dielectric breakdown field, a higher power control index, and the highest thermal conductivity as compared with the above semiconductor materials, and research and development have been advancing toward practical application. Further, since a nitrogen-vacancy (NV) center in diamond is capable of highly sensitive magnetic detection at room temperature, this is expected to be applied to magnetic sensors, and research and development in this field have also been conducted (see WO 2015/107907 A1).

Single crystal diamond which is expected to be applied to these semiconductors is synthesized by a high pressure and high temperature (HPHT) method and homoepitaxial growth, and these synthesis methods make it difficult to increase the area of a bulk substrate of single crystal diamond for use in semiconductor processes. Accordingly, a chemical vapor deposition (CVD) method has been applied in which single crystal diamond is heteroepitaxially grown by using a single crystal magnesium oxide (MgO) as a base crystal, because this CVD method is advantageous in increasing the area.

In the heteroepitaxial growth by means of the CVD method, a bulk crystal of single crystal diamond, which is grown in the same orientation as the crystal orientation of the base MgO crystal, is obtained. That is, a bulk crystal of diamond with a crystal orientation [100] is obtained when the crystal orientation of the base MgO crystal is [100], and a bulk crystal of diamond with a crystal orientation [111] is obtained when the crystal orientation of the base MgO crystal is [111]. In the application of single crystal diamond to a magnetic sensor, it is necessary to form a high-density NV center and align the orientation axes of the NV center. Since a technique for orienting a high-density NV center in the [111] direction has been established by the CVD method, there has been an increasing need for a (111) bulk crystal using single crystal diamond having a main surface as a (111) surface (see WO 2015/046294 A1 and JP 2021-080153 A).

SUMMARY

Meanwhile, a bulk crystal of single crystal diamond obtained by heteroepitaxial growth is sliced and processed into a plate-like substrate, but diamond is hard and not easy to be processed. As a method for processing into a substrate, a smart cut technique is used in which a defective layer is introduced by ion implantation and is removed by etching to thereby perform delamination, but there has been a problem that a device in a high vacuum environment is required for ion implantation, and the processing time is long. Although it is possible to perform delamination with a thickness of several μm, there have been no cases of delamination with a thickness of several hundred μm.

Other methods for processing into a substrate include polishing a bulk crystal of single crystal diamond, which is separated from a base crystal, to a desired thickness, or applying chemical mechanical polishing (CMP). Further, single crystal diamond obtained by means of the conventional HPHT method is processed to slice an ingot, or a block made by further cutting an ingot to a fixed length, into a substrate, but there has been a problem that a loss occurs as a cutting margin. Since it is especially difficult to polish a bulk crystal of single crystal diamond with the [111] orientation, the development of a manufacturing method for obtaining a (111) substrate has been required.

As described above, there has been a need for a manufacturing method in which a bulk crystal, an ingot, or a block of (111) single crystal diamond, which is expected to be applied to a high-precision magnetic sensor, is sliced into a substrate with a reduction in processing loss due to a cutting margin by means of a relatively simple method.

The present invention has been made in view of the above circumstances, and an object of the present invention is to provide a method of manufacturing a diamond substrate by which a (111) substrate is manufactured with little processing loss from a bulk crystal of single crystal diamond with an [111] orientation, which is heteroepitaxially grown by a CVD method, and from an ingot or a block of single crystal diamond obtained by an HTHP method.

In order to solve the above problem, a method of manufacturing a diamond substrate according to the present invention includes: a step of placing a laser condensing unit configured to condense laser light so as to face an upper surface of a block of single crystal diamond; a step of forming a modified layer, which includes a processing mark of graphite and a crack extending along a surface (111) around the processing mark, in a partial region of the upper surface of the block, along the surface (111) of the single crystal diamond, at a predetermined depth from the upper surface of the block by radiating the laser light on the upper surface of the block from the laser condensing unit and condensing the laser light inside the block, and moving the laser condensing unit and the block in a relative manner two-dimensionally; and a step of forming a cleavage plane at the predetermined depth of the remaining region of the upper surface of the block by spontaneously propagating cleavage from the modified layer.

The method of manufacturing a diamond substrate may further include a step of causing the block to spontaneously delaminate into a portion up to a depth from the upper surface to the modified layer or the cleavage plane, and a portion deeper than the modified layer or the cleavage plane. The block may have a plate-like shape having an upper surface as the (111) surface of the single crystal diamond.

The step of forming the modified layer may include a step of moving the laser condensing unit and the block in a relative manner in a predetermined scanning direction, and a step of moving the laser condensing unit and the block in a relative manner in a direction orthogonal to the scanning direction at a predetermined interval.

The laser light may be pulsed laser light, and the graphite of the processing mark may be formed by laser light reflected by a crack extending from another adjacent processing mark in at least one of the scanning direction and the direction orthogonal to the scanning direction. The laser light may have a pulse width in a range of several ns to several hundred ns.

The present invention makes it possible to manufacture a (111) substrate with little processing loss from a bulk crystal of single crystal diamond with an [111] orientation, and an ingot or a block of single crystal diamond obtained by an HTHP method, thereby making it possible to improve the yield in manufacturing the diamond substrate.

DETAILED DESCRIPTION

Next, an embodiment of the present invention will be described with reference to the drawings. In the following drawings, the same or similar portions are denoted by the same or similar numerals. However, it should be noted that the drawings are schematic, and the relationship between the thickness and the plane dimensions, the ratios of the thickness of each layer, and the like are different from those in reality. Therefore, the specific thickness and dimensions should be determined in consideration of the following description. Also, it is needless to say that portions having different dimensional relationships and ratios among the drawings are included.

Further, the following embodiments exemplify devices and methods for embodying the technical idea of the present invention, and the embodiments of the present invention do not specify the materials, shapes, structures, arrangements, etc. of the components as follows. Various modifications may be made to the embodiments of the present invention in the claims.

Figure 1:
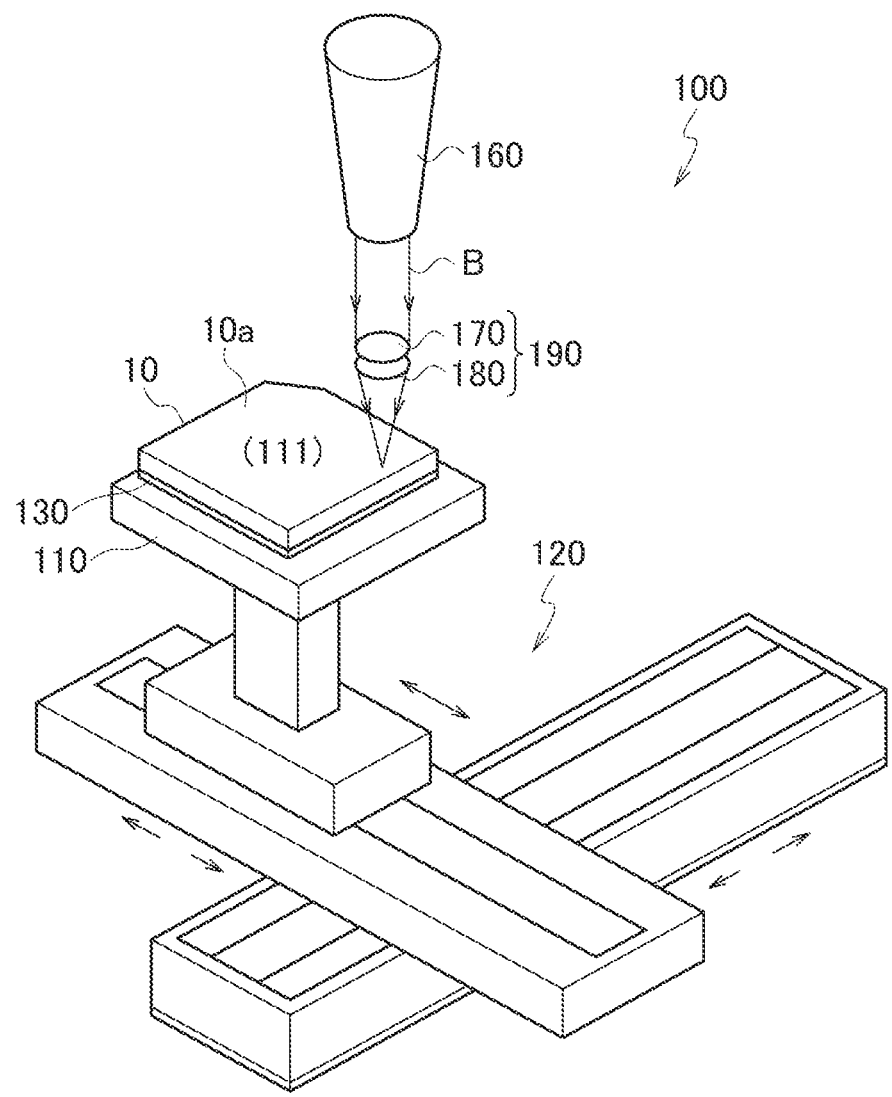
FIG. 1 is a perspective view illustrating a schematic configuration of a processing device.

FIG. 1 is a perspective view illustrating a schematic configuration of a processing device 100. The processing device 100 includes a stage 110 for placing a block 10 of single crystal diamond thereon, a stage support unit 120 for supporting the stage 110 so as to be movable in the XY direction in a horizontal plane, and a fixture 130 for fixing the block 10 of single crystal diamond. An adhesive layer, a mechanical chuck, an electrostatic chuck, a vacuum chuck, or the like may be applied for the fixture 130.

The plate-like block 10 having a rectangular outer periphery, which is formed by cutting an ingot of single crystal diamond to a predetermined length as an object to be processed, is fixed on the stage 110 with a (111) surface as an upper surface 10a. The (111) surface serving as a main surface has an off-angle of 0 degrees. An object to be processed is not limited to this shape, and as long as the upper surface 10a serves as the (111) surface, an ingot of single crystal diamond, a disk-shaped wafer, or a bulk crystal of single crystal diamond may be employed.

The processing device 100 includes a laser light source 160 for generating pulsed laser light, and a laser condensing unit 190 including an objective lens 170 and an aberration adjusting unit 180, and radiates laser light B, which is emitted from the laser light source 160, toward the (111) surface of the upper surface of the block 10 of single crystal diamond via the laser condensing unit 190.

Figure 2A:
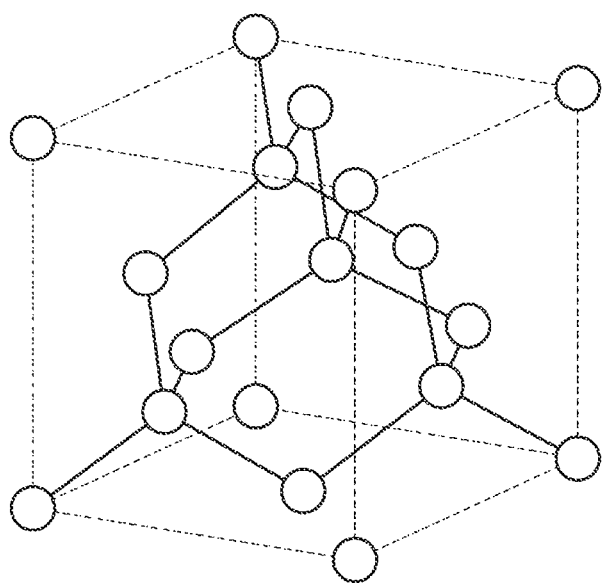
FIGS. 2A and 2B are perspective views illustrating a crystal structure of diamond.
Figure 2B:
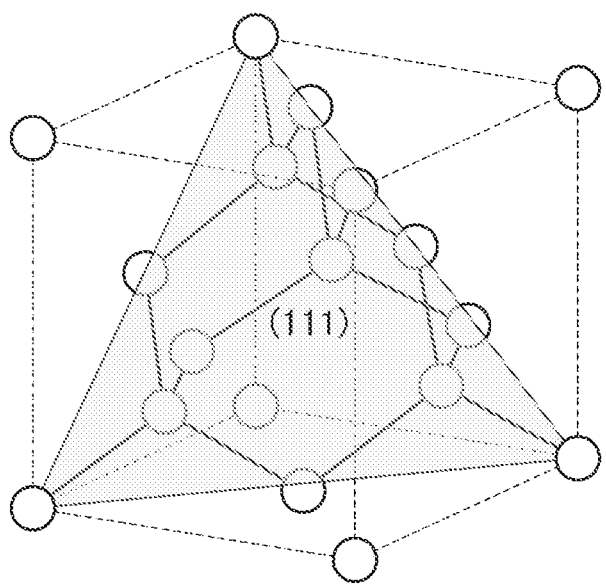

FIGS. 2A and 2B are perspective views illustrating a crystal structure of diamond. As illustrated in FIG. 2A, in a diamond crystal, carbon atoms indicated by white circles are covalently bonded to adjacent carbon elements by the arms of $sp^3$ hybrid orbitals extending in the direction of the four respective vertices of the tetrahedron centered on the carbon atoms. The covalent bonds are illustrated as solid lines. The carbon atoms, which are covalently bonded to each of the four adjacent carbon atoms, form a body-centered cubic lattice called a diamond structure.

FIG. 2B illustrates the (111) surface in the diamond structure. It is conventionally known that single crystal diamond is very hard because carbon atoms form covalent bonds with four respective adjacent carbon atoms in a diamond structure. However, a carbon atom is covalently bonded to an adjacent carbon atom in the <111> direction by only a single arm of the $sp^3$ hybrid orbital. Accordingly, when the covalent bond of the single arm is cut off, it is relatively easy to separate the carbon atom from the adjacent carbon atom in the direction of the (111) surface orthogonal to the <111> direction. As a result, the (111) surface becomes a cleavage surface.

Figure 3:
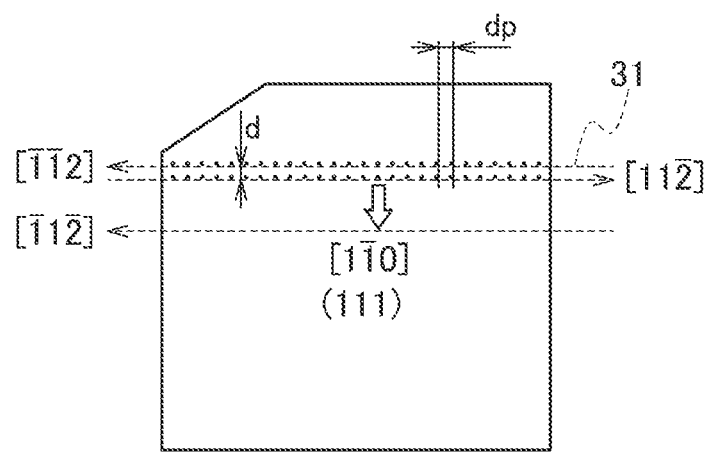
FIG. 3 is a plan view of a block of single crystal diamond illustrating scanning of laser light.

FIG. 3 is a plan view of the block 10 of single crystal diamond illustrating scanning of the laser light B. The block 10 of single crystal diamond placed on the stage 110 of the processing device 100 illustrated in FIG. 1 moves two-dimensionally in the XY direction in a horizontal plane relative to the laser condensing unit 190 such that the laser light B radiated from the laser light condensing unit 190 is radiated toward a predetermined position on the upper surface 10a of the block 10 of single crystal diamond. Here, the block 10 has the (111) surface, which serves as a main surface with an off-angle of 0 degrees, as the upper surface 10a.

A scanning line 31 of the laser light B is first scanned in the [$\bar{1}\bar{1}2$] direction at a dot pitch dp, and shifted by a line pitch d in the [1$\bar{1}$0] direction orthogonal to the [$\bar{1}\bar{1}2$] direction, and the laser light B is scanned in the [11$\bar{2}$] direction at a dot pitch dp to form a new scanning line 31. By repeating the formation of the scanning line 31 in this way, a modified layer 20 is continuously formed along the (111) surface inside the block 10 of single crystal diamond.

Inside the block 10 of single crystal diamond, the laser light B is condensed from the upper surface 10a at a predetermined depth, and a processing mark of graphite and a crack extending along the (111) surface around the processing mark are formed. The laser light B of a nanosecond pulse laser, which is emitted from the laser light source 160, is reflected by the crack formed along the (111) surface as the cleavage surface, and the diamond is pyrolyzed, and thus the processing mark of graphite is formed. Here, the nanosecond pulse laser refers to a laser having a pulse width, that is, a pulse duration in the range of several ns to several hundred ns, more specifically, in the range of 1 ns or more to less than 1 μs.

FIGS. 4A to 4D are plan views illustrating the formation of the modified layer 20 in the block 10 of single crystal diamond. FIGS. 5A to 5D are cross-sectional views illustrating the formation of the modified layer 20 in the block 10 of single crystal diamond. FIGS. 5A to 5D respectively correspond to cross sections formed by the cutting lines in FIGS. 4A to 4D.

Figure 4A:
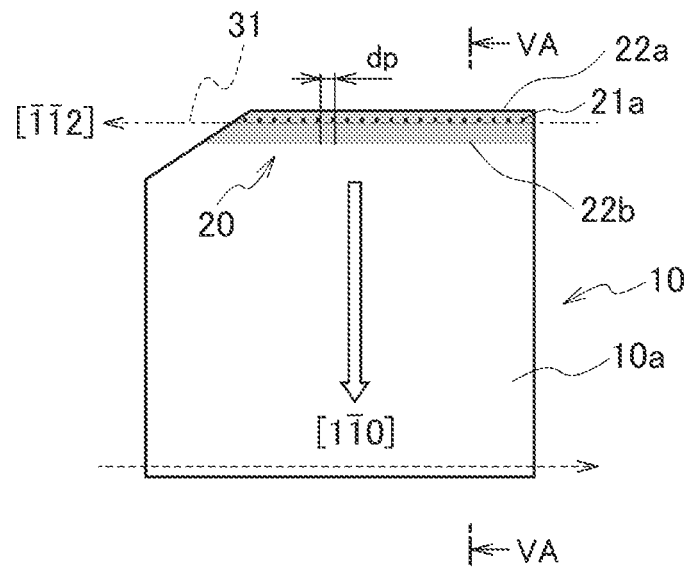
FIGS. 4A to 4D are plan views illustrating the formation of a modified layer in the block of single crystal diamond.
Figure 5A:
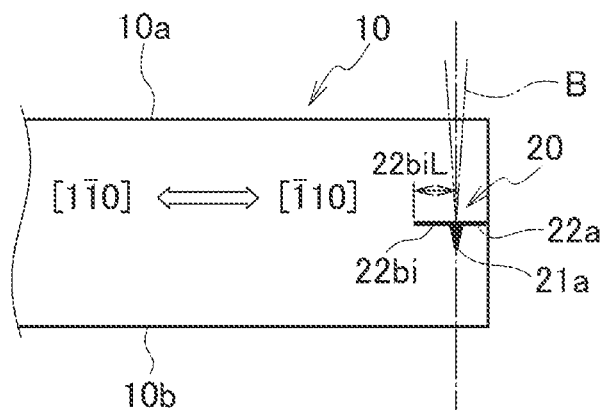
FIGS. 5A to 5D are plan views illustrating the formation of a modified layer in the block of single crystal diamond.

Referring to FIGS. 4A and 5A, a first scan line 31 is directed in the [$\overline{1}\overline{1}2$] direction, and a processing mark 21a is directed toward the lower surface 10b facing the upper surface 10a in the block 10 of single crystal diamond. In addition, a crack 22a extending in the [$\overline{1}10$] direction, and a crack 22bi extending in the [$1\overline{1}0$] direction are formed along the (111) surface due to cleavage from the processing mark 21a, and the modified layer 20 including the processing mark 21a, the crack 22a, and the crack 22bi is formed around the first scan line 31. The processing mark 21a has a conical shape which has the bottom surface near the cracks 22a and 22bi and the vertex in the direction of the lower surface 10b. In the processing mark 21a, the diamond is pyrolyzed into graphite by the condensed laser light B. Here, the length 22biL of the crack 22bi extending in the [$1\overline{1}0$] direction is adjusted by the energy of the laser light B at the condensing point, the irradiated dot pitch dp, and the expansion of the processing mark 21a controlled by the focal depth.

Figure 4B:
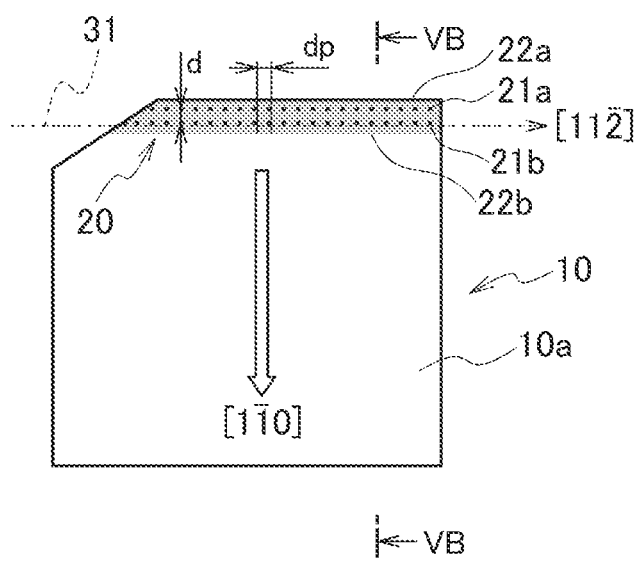
Figure 5B:
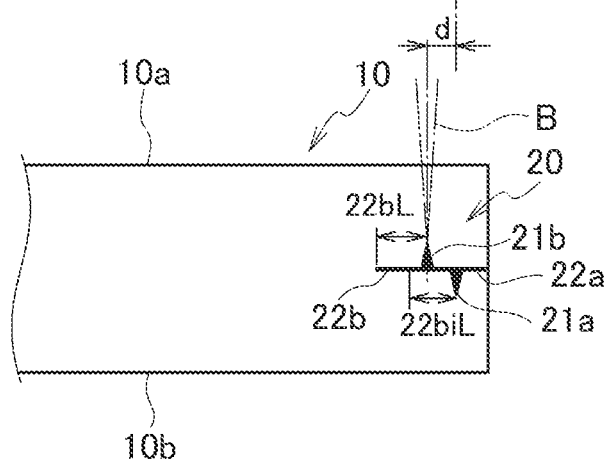

Referring to FIGS. 4B and 5B, a second scan line 31 is performed after the laser condensing unit 190 moves in a relative manner two-dimensionally by the line pitch d from the first scan line 31 in the [$1\overline{1}0$] direction orthogonal to the scanning direction of the first scan line 31. At this time, the line pitch d is set such that the focal point of the laser light B is on the crack 22bi. That is, the relationship between the line pitch d and the length 22biL of the crack 22bi is the length 22biL>the line pitch d.

A second scan line 31 is directed in the [$11\overline{2}$] direction, and a processing mark 21b is directed toward the upper surface 10a. In addition, a crack 22b extending in the [$1\overline{1}0$] direction along the (111) surface is formed due to cleavage from the processing mark 21b, and the modified layer 20 including the processing mark 21b, the cracks 22b and 22bi is formed around the second scan line 31. The processing mark 21b has a conical shape which has the bottom surface near the cracks 22b and 22bi and the vertex in the direction of the upper surface 10a. In the processing mark 21b, the diamond is pyrolyzed into graphite by the condensed laser light B.

Here, cleavage of a length of 22bL occurs in the crack 22b along the (111) surface in the [$1\overline{1}0$] direction due to expansion of the processing mark 21b, and thus the modified layer 20 expands. At this time, cleavage also develops in the cracks 22bi and 22a due to the expansion of the processing mark 21b, and as a result, a continuous cleavage surface is formed in the cracks 22a, 22bi and 22b.

The scanning direction of the laser light B in the first scanning line 31 is not particularly limited to the [$\overline{1}\overline{1}2$] direction, and the scanning direction of the laser light B in the second scanning line 31 is not particularly limited to the [$11\overline{2}$] direction. The first scanning line 31 and the second scanning line 31 may be scanned in the [$11\overline{2}$] direction and in the [$\overline{1}\overline{1}2$] direction, respectively, or may be scanned in only one direction. In this regard, however, a scanning direction in which a reciprocal operation is performed is preferable in consideration of the efficiency of moving the laser condensing unit 190 and the block 10 of single crystal diamond in a relative manner.

Figure 4C:
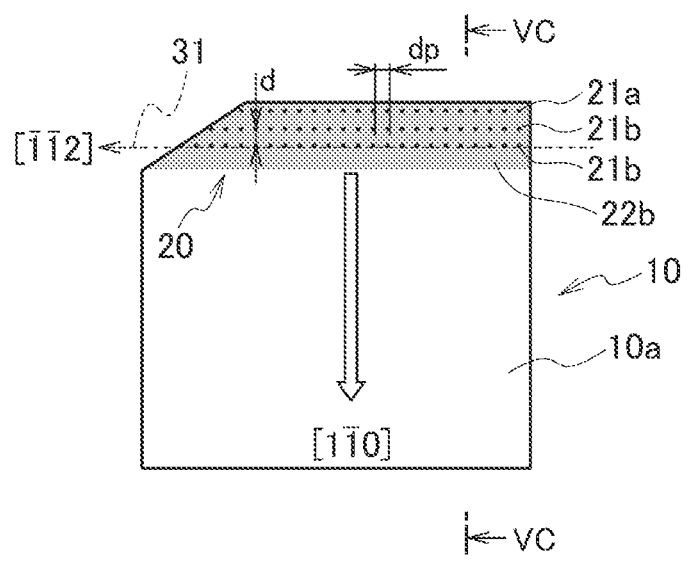
Figure 5C:
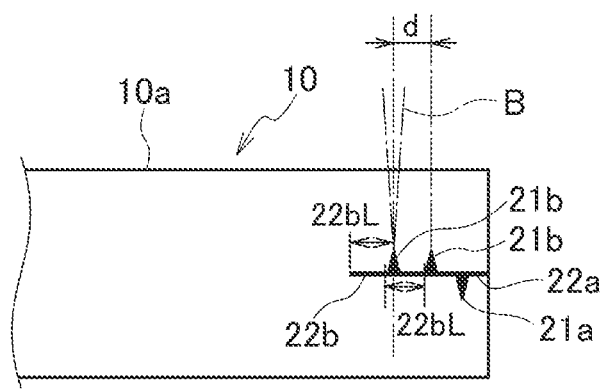

Referring to FIGS. 4C and 5C, a third scan line 31 is performed after the laser condensing unit 190 moves in a relative manner two-dimensionally by the line pitch d from the second scan line 31 in the [$1\overline{1}0$] direction orthogonal to the scanning direction of the second scan line 31. At this time, the line pitch d is se such that the focal point of the laser light B is on the crack 22b where the cleavage has occurred. That is, the relationship between the line pitch d and the length 22bL of the crack 22b is the length 22bL>the line pitch d.

The third scan line 31 is directed in the [$\overline{1}\overline{1}2$] direction, and the processing mark 21b is directed toward the upper surface 10a. In addition, the crack 22h extending in the [$1\overline{1}0$] direction along the (111) surface is formed due to cleavage from the processing mark 21b, and the modified layer 20 including the processing mark 21b and the crack 22b is formed around the third scan line 31. The processing mark 21b has a conical shape which has the bottom surface near the crack 22bi and the vertex in the direction of the upper surface 10a. In the processing mark 21b, the diamond is pyrolyzed into graphite by the condensed laser light B. Here, cleavage of the length 22bL occurs in the crack 22b along the (111) surface in the [$1\overline{1}0$] direction due to expansion of the processing mark 21b, and thus the modified layer 20 expands.

Figure 4D:
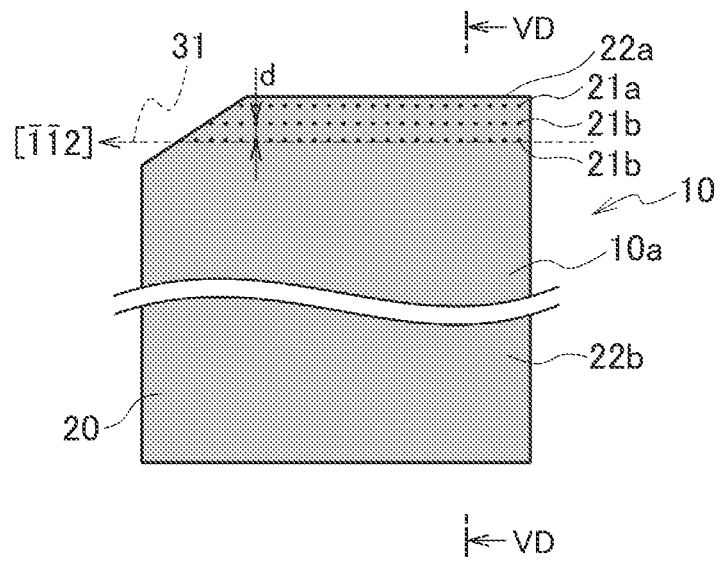
Figure 5D:
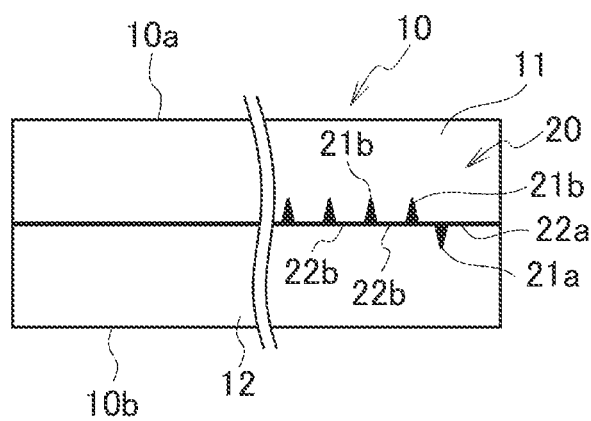

Referring to FIGS. 4D and 5D, the same operation is repeated after the fourth scan line 31 up to the $n^{th}$ scan line 31 toward the end face of the block 10. When the effect of the graphitized processing mark 21b in the $n^{th}$ scan line 31 exceeds a threshold value, cleavage develops from the processing mark 21b in the $n^{th}$ scan line 31 to the end face of the block 10. As a result, the modified layer 20 cleaved in the (111) surface along the crack 22b is formed in the entire surface inside the block.

A large amount of internal stress is accumulated in the modified layer 20 due to a rapid temperature change when forming the processing mark 21b and the change in the crystal structure from diamond to graphite. In order to release such internal stress, the modified layer 20 spontaneously breaks along the (111) surface as the cleavage surface. Accordingly, at the modified layer 20, the block 10 of single crystal diamond spontaneously delaminates into a first portion 11 from the upper surface 10a to the modified layer 20, and a second portion 12 from the modified layer 20 to the lower surface 10b. At least one of the delaminated first portion 11 and the delaminated second portion 12 may be used as a substrate of single crystal diamond. This substrate may include a wafer.

Here, most of the whole surface is taken up by the cleavage plane where the processing mark 21b caused by the radiation of the laser light B does not exist, thereby making it possible to simplify the process of polishing a delaminated substrate, and obtain a delaminated surface having no damage caused by the radiation of the laser light B. Further, it is also possible to shorten the time required for scanning the scanning line 31, thereby making it possible to greatly improve the productivity by shortening the processing time.

In the block 10 of single crystal diamond delaminated into the first portion 11 and the second portion 12, the modified layer 20 corresponds to a "cutting margin" to be lost by processing. The thickness of the modified layer 20 is equivalent to the height of the processing mark 21b of graphite having a substantially conical shape, and can be set within a range of several μm or less. Accordingly, it is possible to reduce the amount of single crystal diamond to be lost in manufacturing a diamond substrate by processing the block 10 of single crystal diamond, thereby making it possible to improve the yield in manufacturing the diamond substrate by processing the block 10 of single crystal diamond.

EXAMPLE

In the processing device 100 illustrated in FIG. 1, a nanosecond laser having the specification shown in TABLE 1 was used as the laser light source 160. Further, as shown in TABLE 2, the block 10 of single crystal diamond was moved in a relative manner two-dimensionally with respect to the laser condensing unit 190, and the laser light B was radiated toward the upper surface 10a, which is the (111) surface, to form the modified layer 20 at a predetermined depth in a partial region of the upper surface 10a. In this Example, Ib-type diamond obtained by means of the HPHT method was employed.

TABLE 1

SPECIFICATION OF LASER LIGHT SOURCE

| LASER OSCILLATOR MODEL | Hippo532-11 (MADE BY SPECTRA PHYSICS) |
|---|---|
| WAVELENGTH | 532 nm |
| PULSE WIDTH | 10 ns |
| REPETITION FREQUENCY | 20 kHz |
| OUTPUT | 1 W |

TABLE 2

LASER LIGHT RADIATION SETTINGS

| SCANNING VELOCITY | 1 mm/s |
|---|---|
| DOT PITCH dp | 0.05 µm |
| LINE PITCH d | 30 µm |

The conditions for the laser light source 160 and the laser light radiation as above were set for the purpose of developing cleavage in the (111) surface due to the expansion of the processing mark 21b by advancing the graphitization through the accumulation of the heat of the laser light B by the condensing unit, and increasing the density of the graphitization. In the above example, when the dot pitch dp is set to 0.05 µm and the line pitch d is set to 30 µm, the graphitized processing mark is increased in density, and cleavage in the (111) surface develops due to stress in the crack 22b. As a result, it is possible to perform cleavage in the (111) surface by performing laser radiation with ten scanning lines, that is, by forming the processing mark 21b in a range of 300 µm from the end of the diamond block.

As for the size of the processing mark 21b, it is necessary to control the processing mark 21b, that is, the growth of the graphitized portion, in order to reduce the loss after delamination. The conditions were set considering that the depth (growth height) of the processing mark 21a formed in the block 10 of single crystal diamond had to be set to 30 µm or less at the maximum.

As described above, the conditions obtained in consideration of the length of the crack 22b and the size of the processing mark 21b were that under a laser output of 1 W and an oscillation frequency of 20 kHz, a suitable range of the dot pitch dp was 0.01 µm to 0.5 µm, and the range of the line pitch d at this time was 10 µm to 50 µm. Since it is difficult to measure the length of the crack 22b, it is considered to be 100 µm to 150 µm in the range estimated from the above line pitch d. TABLEs 1 and 2 were set based on these considerations.

Under the conditions as shown in TABLEs 1 and 2, a predetermined range of the upper surface 10a of the block 10 of single crystal diamond in the vertical direction was scanned by using the ten scanning lines 31, and the modified layer 20 was formed in this scanned region at a predetermined depth from the upper surface 10a. As a result, the cleavage propagated spontaneously along the (111) surface of the cleavage surface at the same predetermined depth as that of the modified layer 20 starting from the modified layer 20, and a cleavage plane 25 was formed at the predetermined depth over the entire surface of the remaining region excluding the partial region where the modified layer 20 was formed. Further, the block 10 of single crystal diamond spontaneously delaminates at the modified layer 20 or the cleavage plane 25 to obtain the first portion 11 from the upper surface 10a to the modified layer 20 or the cleavage plane 25, and the second portion 12 deeper than the modified layer 20 or the cleavage plane 25.

Figure 6:
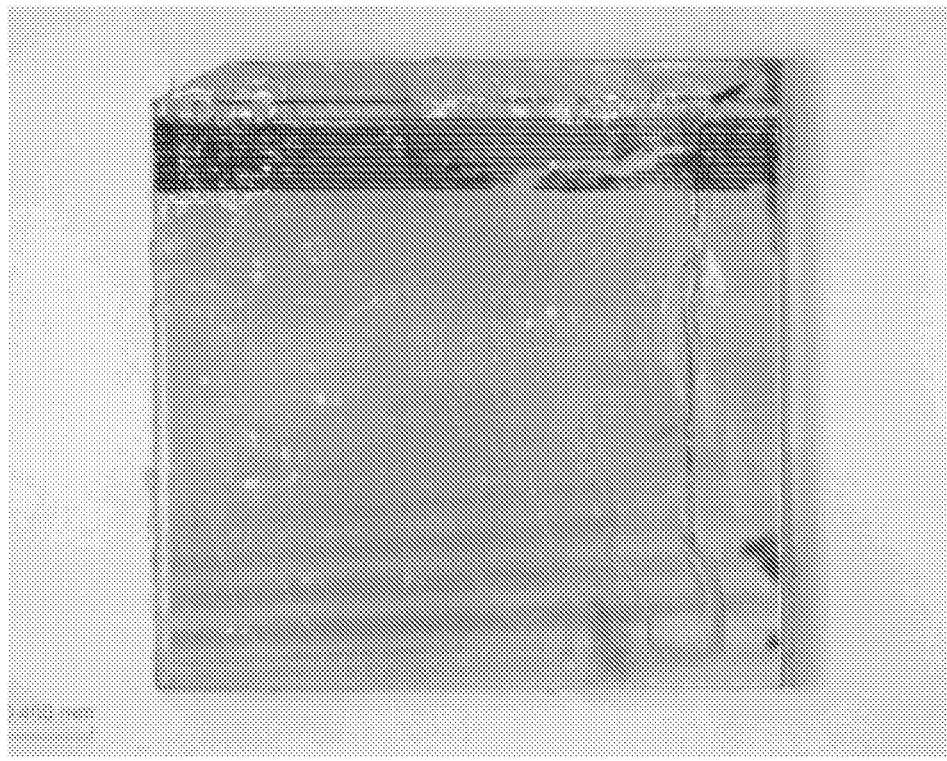
FIG. 6 is a photograph illustrating a delaminated surface of the block of single crystal diamond which has delaminated at the modified layer or a cleavage surface.

FIG. 6 is a photograph illustrating a delaminated surface of the block 10 of single crystal diamond which has delaminated at the modified layer 20 or the cleavage plane 25. In the delaminated surface, the processing marks 21 using graphite formed along the ten scanning lines 31 are observed. It is observed that the cleavage plane 25, which is the (111) surface, forms a smooth surface in the portion other than the processing marks 21 in the delaminated surface.

In the above example, when the dot pitch dp is set to 0.05 µm and the line pitch d is set to 30 µm, the graphitized processing marks are increased in density, which results in cleavage in the (111) surface developing due to stress in the crack 22b. As a result, it is possible to perform cleavage in the (111) surface by performing laser radiation with the ten scanning lines, that is, by forming the processing mark 21b in a range of 300 µm from the end of the diamond block. Since the outer dimension of the block 10 of single crystal diamond used in this example in the [1$\bar{1}$0] direction is 2.5 mm, about 90% of the surface of the diamond substrate obtained by delamination is formed by the cleavage plane in the (111) surface where the processing mark 21b does not exist. As the cleavage plane obtained in this way is a smooth surface, there is a great advantage that the next processing step such as polishing and etching can be greatly simplified.

Figure 7A:
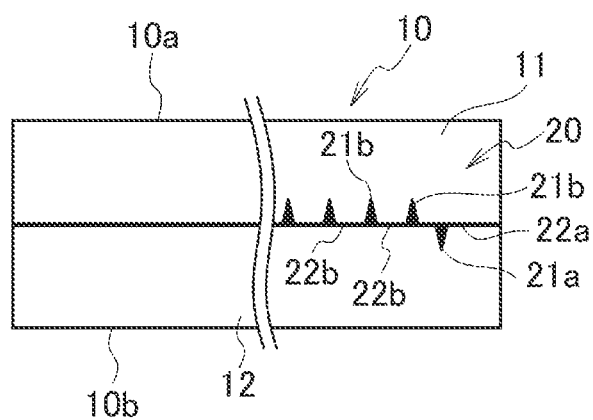
FIGS. 7A and 7B are cross-sectional views illustrating a method of manufacturing a plurality of diamond substrates from the block of single crystal diamond.
Figure 7B:
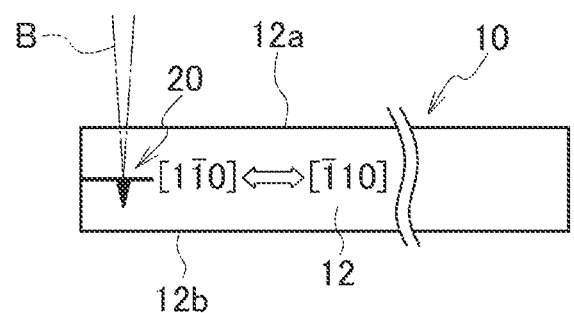

FIGS. 7A and 7B are cross-sectional views illustrating a method of manufacturing a plurality of diamond substrates from the block 10 of single crystal diamond. FIG. 7A illustrates the block 10 of single crystal diamond in which the modified layer 20 is formed before delamination, and FIG. 7B illustrates the second portion 12 where the modified layer 20, which is a cleavage surface, has delaminated from the block 10 of single crystal diamond. The upper surface 12a of the second portion 12 corresponds to the cleavage plane in the block 10 of single crystal diamond, and the lower surface 12b of the second portion 12 corresponds to the lower surface 10b of the block 10 of single crystal diamond.

Radiating the laser light B from the upper surface 12a of the second portion 12 in accordance with TABLEs 1 and 2, forming the modified layer 20 in the second portion 12, and delaminating the modified layer 20 as a cleavage surface make it possible to manufacture a new diamond substrate. Repeating this process brings the great advantage that it is possible to produce a substrate from diamond, which is a difficult-to-cut material, by means of an extremely efficient and simple method with greatly reduced processing loss.

The present invention can be utilized for manufacturing a power device or a magnetic sensor using a diamond substrate.

What is claimed is:

1. A method of manufacturing a diamond substrate comprising:
   a step of placing a laser condensing unit configured to condense laser light so as to face an upper surface of a block of single crystal diamond;
   a step of forming a modified layer, which includes a processing mark of graphite and a crack extending along a surface (111) around the processing mark, in a partial region of the upper surface of the block along the surface (111) of the single crystal diamond, at a predetermined depth from the upper surface of the block by radiating the laser light on the upper surface of the block from the laser condensing unit and condensing the laser light inside the block, and moving the laser condensing unit and the block in a relative manner two-dimensionally,
   wherein the step of forming the modified layer includes:
      a step of moving the laser condensing unit and the block in a relative manner in a predetermined scanning direction; and
      a step of moving the laser condensing unit and the block in a relative manner in a direction orthogonal to the scanning direction at a predetermined interval, wherein the laser condensing unit moves in a relative manner two-dimensionally by a predetermined line pitch in the direction orthogonal to the scanning direction;
   a step of forming a cleavage plane at the predetermined depth of a remaining region of the upper surface of the block by spontaneously propagating cleavage from the modified layer; and
   a step of causing the block to spontaneously delaminate into a portion up to a depth from the upper surface to the modified layer or the cleavage plane, and a portion deeper than the modified layer or the cleavage plane,
   wherein the block has a planar surface as an upper surface as the (111) surface of the single crystal diamond.

2. The method of manufacturing a diamond substrate according to claim 1, wherein the laser light is pulsed laser light, and the graphite of the processing mark is formed by laser light reflected by a crack extending from another adjacent processing mark in at least one of the scanning direction and the direction orthogonal to the scanning direction.

3. The method of manufacturing a diamond substrate according to claim 1, wherein the laser light has a pulse width in a range of several ns to several hundred ns.

* * * * *